Sept. 24, 1963

R. R. SCOVILLE 3,104,926

SOLDERLESS TERMINAL

Filed Feb. 20, 1961

INVENTOR

R. R. Scoville

BY *Moore & Hall*

ATTORNEYS 3,104,926
SOLDERLESS TERMINAL
Ray R. Scoville, 1100 Flower St., Glendale 1, Calif.
Filed Feb. 20, 1961, Ser. No. 90,279
10 Claims. (Cl. 339—254)

The present invention relates to terminal structures for interconnecting electrical components in circuit configurations; and is more particularly concerned with an improved terminal adapted to interconnect relatively large numbers of components variously oriented relative to a circuit board, in low contact resistance connections, without the need of solder or like agents.

Various terminals have been suggested heretofore which are adapted to receive and interconnect electrical components such as resistors, capacitors, semi-conductor devices, etc. In general, terminals of the types suggested heretofore are arranged to retain lead wires from such components by means of solder or like fastening agents. It has, however, been long recognized that such solder-type terminals exhibit disadvantages in certain applications. In applying solder there is always the danger of subjecting various components, e.g. sensitive transistors and diodes, to excessive heat. Moreover, the use of solder causes the resulting circuit to be relatively permanent in nature, whereby components cannot be readily added to or removed from the terminal. This in turn makes such solder-type terminals undesirable for use in experimental applications wherein it may be necessary to interchange various components, or add or remove components to a given terminal during the development of a circuit.

In recognition of this latter circumstance, various forms of so-called solderless terminals have also been suggested heretofore. These terminals are generally arranged to receive the lead wires of components and to retain such lead wires in place through use of mechanical arrangements associated with the terminal itself. In some instances it has been suggested that the terminal take the form of a coil spring adapted to receive such component lead wires between the convolutions thereof whereby the lead wires are interconnected through said convolutions and are simultaneously held in place by the resilience of the spring. Other arrangements have also been suggested.

As a general matter, however, the various forms of solderless terminals which have been suggested heretofore have been subject to a number of disadvantages. They have, for example, taken configurations such that only a limited number of lead wires can be accepted by a given terminal structure; and typically, spring-type solderless terminals utilized heretofore have generally accepted only one or two component leads. Terminals of the types suggested in the past have moreover, exhibited relatively high contact resistance whereby the use of the terminal, without solder, has introduced undesirable resistive components into the circuit being fabricated, which resistive components are of sufficient magnitude to disrupt an experimental circuit being developed. The terminals suggested heretofore have, moreover, often taken such form that they cannot be readily installed into or removed from a circuit board, thereby again complicating the problem of circuit development.

The present invention, recognizing these various difficulties of prior solderless terminals, is accordingly concerned with a highly improved terminal adapted to obviate all of the mentioned disadvantages.

It is accordingly an object of the present invention to provide an improved terminal adapted to permit fast and reliable circuit setups without soldering.

Another object of the present invention resides in the provision of an electrical terminal adapted to permit the connecting and disconnecting of as many as six or more component leads, without the need for soldering, crimping, or bending of wires.

A still further object of the present invention resides in the provision of an improved solderless terminal adapted to receive a relatively large number of component leads from various different orientations, and of various different wire sizes, in the fabrication of any given circuit.

A still further object of the present invention resides in the provision of an improved terminal adapted to be used in both experimental applications and in various non-experimental permanent holding applications where soldering is undesirable.

Still another object of the present invention resides in the provision of an improved solderless terminal exhibiting substantially lower contact resistance than has been possible in terminals suggested heretofore.

A still further object of the present invention resides in the provision of an improved solderless terminal which may be readily added to or removed from circuit boards and readily reused.

Another object of the present invention resides in the provision of a solderless terminal which is relatively inexpensive, and which is more reliable in operation than other terminals suggested heretofore.

In providing for the foregoing objects, the present invention contemplates the provision of a terminal taking the form of a substantially U-shaped terminal member, having a U-shaped post at one end thereof adapted to be inserted into a circuit board aperture. The post is so constructed that the sides thereof exhibit resilience whereby the terminal member is resiliently retained within said circuit board aperture and may be readily removed therefrom; and, as will appear hereinafter, the provision of such a post also permits the terminal to be permanently staked in place when a permanent installation is desired.

The U-shaped terminal member includes an integral projection adapted to act as a seat for the terminal member on the circuit board, and also adapted to act as a stop or abutment for a coil spring placed in surrounding relation to said U-shaped terminal member. A washer member is also placed in surrounding relation to the terminal member, adjacent an uppermost end of the aforementioned coil spring, and this washer member is restrained in its upward movement by portions of the terminal member crimped so as to overlie an upper surface of the washer. The U-shaped terminal member moreover preferably defines an elongated slot in the bottom or base of its U-shaped configuration, which slot is adapted to receive component leads over or through said coil spring, and also defines a further bent-over projection overlying the upper end of the terminal for the reception of additional component leads.

The overall arrangement, as will appear hereinafter, is such that component leads can be attached to the U-shaped post below the circuit board, and further such leads can also be attached to the terminal above the circuit board, in directions between adjacent convolutions of the spring, passing through convolutions of the spring and the aforementioned slot below the aforementioned washer; passing through the aforementioned slot above the aforementioned washer; lying between the washer and the aforementioned crimped-over parts of the terminal, and engaging the bent-over projection at the uppermost portion of the terminal. These various possible connection arrangements, which will become more readily apparent as the description proceeds, permit relatively large numbers of component leads to be accepted by the terminal at positions both above and below a circuit board, without regard either to variations in dimensions of individual component leads so accepted or to variations in the orientation of the component relative to the circuit board. Moreover, the various parts of the terminal are silver-plated, and this construction, cooperating with strong mechanical forces exerted by the spring member in the terminal, results in appreciably lower contact resistances than has been possible heretofore, actual tests showing less than 0.002 ohm resistance between the leads and the terminal.

The foregoing objects, advantages, construction and operation of the present invention will become more readily apparent from the following description and accompanying drawing, in which.

Figure 1:
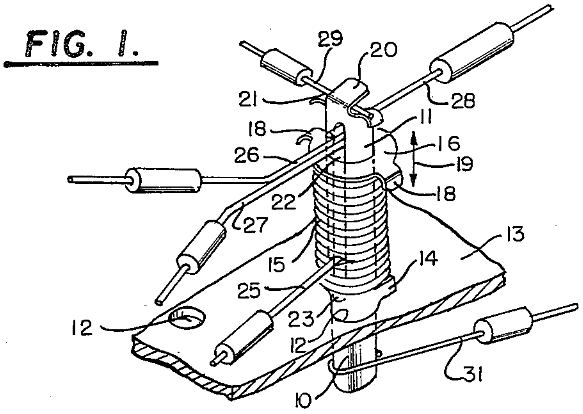
FIGURE 1 is a perspective view of an installed terminal constructed in accordance with the present invention.
Figure 2:
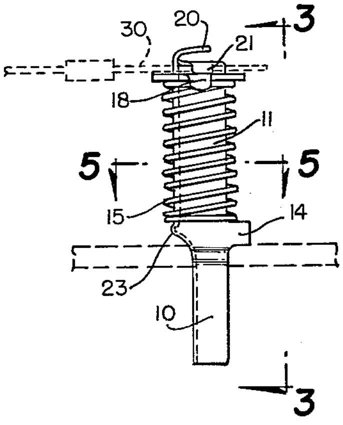
FIGURE 2 is a side view of the terminal shown in FIGURE 1.

Referring now to the several figures, like numerals of which refer to like parts throughout, it will be seen that the terminal of the present invention comprises a pair of interconnected U-shaped members 10 and 11. U-shaped member 10 is smaller in diameter than U-shaped member 11, and comprises a resilient post adapted to be inserted into one of several apertures 12 provided in a terminal board 13, thereby to resiliently hold said terminal in place relative to board 13. This provision of such a U-shaped holding member or post has been described in my prior Patent No. 2,947,965, issued August 2, 1960, for "Push-In Terminal Lugs," and causes the terminal to be resiliently and removably retained in place. However, as also described in my said prior patent, said terminal may be permanently staked in place by flaring the sides of U-shaped member 10 outwardly, e.g. with a pliers, below terminal board 13.

The U-shaped members 10 and 11 are integral with one another, and the terminal defines a pair of outwardly projecting legs 14—14*a* between said U-shaped portions 10 and 11. Legs 14—14*a*, comprising integral portions projecting from and substantially coplanar with the sides of U-shaped terminal member 11, extend in directions generally parallel to one another and to the surface of board 13. The lower edges of said projecting legs 14—14*a* thus seat the terminal in place relative to board 13, and act as stops restraining downward movement of the terminal in board aperture 12.

The upper edges of the legs 14—14*a* also act as a seat or stop for a spirally wound coil spring 15, having an inside diameter slightly larger than that of upper U-shaped member 11, and disposed in surrounding relation to said upper U-shaped member 11 as illustrated in the several figures. The coils of spring 15 are exposed in the assembled terminal whereby, as will be described, component leads may be readily inserted between the several convolutions of the spring.

The upper end of the spring 15 is surmounted by a washer 16 having an internal aperture 17 of a diameter slightly larger than that of upper U-shaped member 11 and slidably disposed thereon; and washer 16 further defines a pair of outstanding finger grips 18 (which may be eliminated if desired) to facilitate manual engagement with washer 16 so that said washer 16 (urged upwardly by spring 15) may be depressed downwardly, generally in the direction of arrow 19 (see FIGURE 1) against the restraint of spring 15 when desired.

The uppermost end of U-shaped member 11 includes a bent-over projection 20 overlying the uppermost end of the terminal, and further defines a pair of crimped-over outstanding ears 21 disposed below the plane of projection 20 and overlying the upper surface of washer

Figure 3:
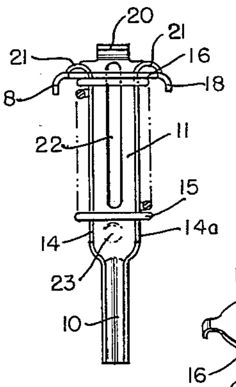
FIGURE 3 is a front view of the terminal taken on line 3—3 of FIGURE 2.
Figure 4:
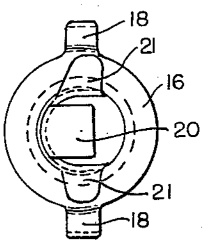
FIGURE 4 is an enlarged top view of the terminal.
Figure 5:
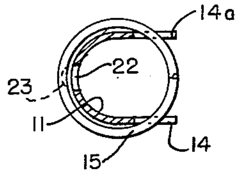
FIGURE 5 is an enlarged sectional view taken on line 5—5 of FIGURE 2.
Figure 6:
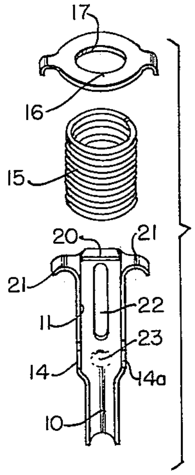
FIGURE 6 is an exploded representation of the various parts comprising the improved terminal of the present invention.

16 (see FIGURES 3 and 4). The ears 21 restrain upward movement of washer 16 and also provide for connections to be made to the terminal between the lower surfaces of said ears and the upper surface of washer 16.

The rear wall, or bottom, of U-shaped member 11 further defines an elongated slot 22, for the reception of component leads, extending along substantially the entire length of member 11 adjacent to the convolutions of spring 15; and said rear wall 11 further defines an outstanding bulge or protuberance 23, which assists legs 14 in restraining downward movement of spring 15 relative to the terminal, and in seating the entire terminal on circuit board 13.

The several parts of the terminal illustrated comprise conductive materials, and in a preferred embodiment, terminal members 10, 11, 14, 14*a*, 20, 21 and 23, as well as the washer 16 and its finger grips 18, are formed of brass, half hard. Spring 15 is preferably formed of steel music wire. All the aforementioned parts of the terminal, washer, and spring, are preferably silver-plated (e.g. in a stearic acid dip) thereby to reduce contact resistance, as discussed previously. It should further be noted that the terminal illustrated in the several figures is much enlarged in size from an actual terminal; and in a preferred embodiment, the entire terminal, from the top of projecting portion 20 to the bottom-most end of post 10, is approximately 0.9 inch. With this dimension of the entire terminal, post 10 thereof (from the bottom edges of legs 14—14*a*) preferably has a length in the order of 0.28 inch, slot 22 preferably has a length of substantially 0.44 inch, the outside diameter of post 10 (in the direction of legs 14—14*a*) is in the order of 0.08 inch, the outside diameter of post 11 (transverse to legs 14—14*a*) is in the order of 0.125 inch, and the outside diameter of washer 16 (exclusive of finger grips 18) is in the order of 0.22 inch. The device is preferably mounted in board apertures 12 taking the form of substantially 3/32" round holes punched into said board 13.

The terminal slot 22 is adapted to accommodate as many as six wires having an average size of up to 0.05 inch in diameter, and additional wires or component leads may be attached to other parts of the terminal. Thus, wires or component leads may be wrapped around U-shaped member 11 between adjacent convolutions of spring 15; may be inserted through slot 22 between such adjacent convolutions, as at 25; may be inserted singly or in groups through slot 22 above washer 16, as at 26 through 28; may be forced under bent-over member 20 and over ears 21, as at 29; or may be inserted between washer 16 and crimped-over ear portions 21, as at 30. Additional component leads may be attached below circuit board 13 by wrapping around post 10, as at 31.

To insert component wires, all that need be done is to press washer 16 downwardly, with the thumb and forefinger, finger grips 18 facilitating this operation, thereby to expose a portion of slot 22; and this portion of said slot can accept as many as six wires, as already discussed. Upon release of washer 16, spring member 15 urges said washer 16 upwardly, thereby firmly binding the inserted component leads between the upper surface of washer 16 and the upper edge of slot 22. Additional component leads may be inserted against the restraint of spring 15 between the upper surface of washer 16 and the lower surfaces of projecting crimped-over ears 21, as well as through slot 22 between convolutions of spring 15, or around member 11 between said convolutions. All such inseretd leads, as well as leads placed under member 20, have low contact resistance and relatively high mechanical stability, notwithstanding the absence of solder, being firmly and resiliently held in place by the terminal. No such resilience is, of course, exhibited by the terminal when component leads are wrapped about post 10 below terminal board 13; and accordingly, it is preferable that any wires connected to this portion of the terminal be soldered thereon. However, if desired, the lower portion of terminal 10 may be slotted, for example in accordance with the configurations described in my prior Patent No. 2,947,965, to facilitate attachment of wires thereto without such solder.

While I have thus described a preferred embodiment of the present invention, many variations will be suggested to those skilled in the art, and it must therefore be emphasized that the foregoing description is meant to be illustrative only and should not be considered limitative of my invention. All such variations and modifications as are in accord with the principles described, are meant to fall within the scope of the appended claims.

Having thus described my invention, I claim:

1. A terminal for electrical connections comprising first and second elongated U-shaped conductive terminal members linearly interconnected to one another, the first of said U-shaped members constituting a post having side walls adapted for resilient insertion into a circuit board aperture to effect resilient removable mounting of said terminal on such a circuit board, said terminal defining outstanding projecting means at a position adjacent one end of said second elongated member, a conductive washer adjacent the other end of said second elongated member disposed in surrounding slidable relation to said second elognated member, said second elongated member defining a crimped restraining member overlying a surface of said washer remote from said projecting means, a conductive coil spring surrounding said second U-shaped terminal member and extending between said conductive washer, at one end of said spring, and said outstanding projecting means at the other end of said spring, whereby said spring urges said washer toward said crimped restraining member, and an elongated slot extending along the base of said second U-shaped member from a position adjacent said projecting means to a position adjacent said restraining member, whereby a portion of said slot may be fully exposed, for the reception of electrical connections, by manually urging said washer away from said restraining member against the resilient force of said spring, and other portions of said slot may be partially exposed for the reception of electrical connections through said spring by distorting adjacent convolutions of said spring.

2. The terminal of claim 1 wherein said first U-shaped member is of smaller diameter than said second U-shaped member.

3. The terminal of claim 1 wherein said crimped restraining member comprises a pair of ears extending in a plane generally parallel to the adjacent surface of said washer whereby electrical connections may be inserted between said ears and washer surface, being resiliently retained in place by the force of said spring urging said washer toward said ears.

4. The terminal of claim 3 wherein said pair of ears are formed, adjacent the free end of said second U-shaped member, as outstanding projections from the two opposite sides of said second U-shaped member, the base of said second U-shaped member, adjacent the free end of said second member, being bent to provide a further projection, disposed between said pair of ears, for the reception of further electrical connections.

5. The terminal of claim 1 wherein said washer defines finger grip means to facilitate said manual urging of said washer.

6. The terminal of claim 1 wherein said outstanding projecting means comprise a pair of legs extending from the two opposite sides of said second U-shaped member in directions transverse to the direction of elongation of said second U-shaped member.

7. The terminal of claim 6 wherein said pair of legs extend in directions generally parallel to one another and generally coplanar with the two opposite sides of said second U-shaped member, said projecting means further including a bulge protrusion extending outwardly from the base of said second U-shaped member at a position between said pair of legs.

8. A terminal for electrical connections comprising a pair of U-shaped terminal members integral with one another in end-to-end relation, one of said U-shaped members constituting a post adapted primarily for insertion into a circuit board aperture and the other of said U-shaped members being adapted primarily to receive electrical connections, said terminal defining projecting means extending outwardly from the sides of said U-shaped terminal members at the junction of said pair of members to define a seat for said terminal against one face of a circuit board when said post is inserted into said board aperture, a conductive washer disposed in surrounding slidable relation to said other U-shaped member, the free end of said other U-shaped member defining restraining means adapted to overlie a surface of said washer remote from said projecting means, spring means extending between said conductive washer and said projecting means thereby to urge said washer normally into engagement with said restraining means, an aperture in one side of said other U-shaped member extending from a position adjacent said projecting means to a position adjacent said restraining means, said spring means normally covering said aperture, and finger grip means extending outwardly from said washer adapted to permit said washer to be manually urged away from said restraining means toward said projecting means against the force of said spring means thereby to expose a portion of said aperture for reception of electrical connections.

9. A unitary terminal for electrical connections comprising a metallic element shaped to define integral first and second elongated U-shaped conductive terminal members each of which has a free end, the first of said U-shaped members constituting an elongated post having its said free end adapted for insertion into a circuit board aperture to effect mounting of said terminal on such a circuit board, said terminal defining means projecting outwardly from a portion of said second elongated member at a position spaced from the free end of said second member, a conductive washer adjacent said free end of said second elongated member disposed in surrounding slidable relation to said second elongated member, said second elongated member defining restraining means adapted to engage a surface of said washer remote from said projecting means, a coil spring surrounding said second U-shaped terminal member and extending between said conductive washer, at one end of said spring, and said outstanding projecting means at the other end of said spring, whereby said spring urges said washer toward said restraining means, and an elongated conductor receiving slot extending along said second U-shaped member from a position adjacent said projecting means to a position adjacent said restraining means whereby a portion of said slot means may be fully exposed, for the reception of electrical connections, by urging said washer away from said restraining means against the resilient force of said spring, and other portions of said slot means may be partially exposed for the reception of electrical connections through said spring by distorting adjacent convolutions of said spring.

10. A terminal for electrical connections comprising a pair of elongated terminal members integral with one another in substantially colinear end-to-end relation, each of said elongated terminal members being of U-shaped cross-section in planes transverse to the directions of elongation of said members, one of said U-shaped members constituting a post adapted primarily for insertion into a circuit board aperture and the other of said U-shaped members being adapted primarily to receive electrical connections, said one U-shaped post member and said other U-shaped connection receiving member being of different diameters, the difference in said diameters of said integral members defining an interconnecting terminal portion at the junction of said members which interconnecting terminal portion at least partially defines a seat for said terminal against one face of a circuit board when said post member is inserted into said board aperture, said terminal also including protruding means disposed adjacent the junction of said pair of members and cooperating with said interconnecting terminal portion to further define said seat for said terminal against said face of said circuit board, restraining means disposed adjacent the free end of said other U-shaped member, spring means extending between said restraining means and said protruding means, said spring means being in partial compression whereby the opposing ends of said springs means are normally urged into engagement with said restraining means and with said protruding means, and an elongated aperture in one side of said other U-shaped member extending from a position adjacent said protruding means to a position adjacent said restraining means, said spring means normally covering said aperture and being adapted to be further compressed thereby to expose a portion of said elongated aperture for reception of electrical connections.

References Cited in the file of this patent

UNITED STATES PATENTS

| | | |
|---|---|---|
| 871,352 | Martin | Nov. 19, 1907 |
| 1,454,879 | Zollner | May 15, 1923 |
| 2,475,448 | Cusato | July 5, 1949 |

FOREIGN PATENTS

| | | |
|---|---|---|
| 79,803 | Denmark | Aug. 22, 1955 |
| 458,369 | Italy | July 10, 1950 |
| 112,291 | Switzerland | Oct. 16, 1925 |